(12) United States Patent
Maruyama

(10) Patent No.: US 10,515,779 B2
(45) Date of Patent: Dec. 24, 2019

(54) IMAGING SYSTEM AND IMAGING METHOD

(71) Applicant: NGR Inc., Yokohama (JP)

(72) Inventor: Kotaro Maruyama, Yokohama (JP)

(73) Assignee: NGR INC., Yokohama (JP)

(\*) Notice: Subject to any disclaimer, the term of this patent is extended or adjusted under 35 U.S.C. 154(b) by 0 days.

(21) Appl. No.: 16/011,006

(22) Filed: Jun. 18, 2018

(65) Prior Publication Data
US 2019/0019651 A1    Jan. 17, 2019

(30) Foreign Application Priority Data
Jun. 20, 2017 (JP) ................. 2017-120525

(51) Int. Cl.
| | |
|---|---|
| *H01J 37/26* | (2006.01) |
| *H01J 37/28* | (2006.01) |
| *H01J 37/244* | (2006.01) |
| *H01J 37/22* | (2006.01) |
| *H01J 37/20* | (2006.01) |

(52) U.S. Cl.
CPC .......... *H01J 37/265* (2013.01); *H01J 37/222* (2013.01); *H01J 37/244* (2013.01); *H01J 37/28* (2013.01); *H01J 37/20* (2013.01); *H01J 2237/20228* (2013.01); *H01J 2237/20235* (2013.01); *H01J 2237/221* (2013.01); *H01J 2237/2448* (2013.01); *H01J 2237/24475* (2013.01); *H01J 2237/2804* (2013.01); *H01J 2237/2806* (2013.01)

(58) Field of Classification Search
CPC ...... H01J 37/265; H01J 37/222; H01J 37/244; H01J 37/28; H01J 37/20; H01J 2237/20228; H01J 2237/20235; H01J 2237/221; H01J 2237/24475; H01J 2237/2448; H01J 2237/2804; H01J 2237/2806
USPC .......................... 250/306, 307, 309, 310, 311
See application file for complete search history.

(56) References Cited

U.S. PATENT DOCUMENTS

| | | | | |
|---|---|---|---|---|
| 2003/0222215 | A1* | 12/2003 | de Robillard | G01N 23/04 250/311 |
| 2018/0204679 | A1* | 7/2018 | Kwak | C04B 35/47 |
| 2018/0301682 | A1* | 10/2018 | Arise | H01M 2/1686 |
| 2019/0126537 | A1* | 5/2019 | Saha | B29C 64/135 |

FOREIGN PATENT DOCUMENTS

JP         10-149792 A      6/1998

\* cited by examiner

*Primary Examiner* — Nicole M Ippolito
(74) *Attorney, Agent, or Firm* — Lathrop Gage LLP

(57) ABSTRACT

An imaging system having a scanning electron microscope capable of rapidly obtaining clear images of inspection targets at different heights is disclosed. The imaging system includes a computer having a memory storing design data including two-dimensional design information of each of layers of a three-dimensional multilayer structure constituting a surface of the specimen, the design data further including height information of each of the layers. The computer is configured to: read the two-dimensional design information and the height information from the memory; calculate a height of an image acquisition position on the specimen from the two-dimensional design information and the height information; and instruct the scanning electron microscope to focus the electron beam on the image acquisition position based on the calculated height of the image acquisition position.

7 Claims, 8 Drawing Sheets

IMAGING SYSTEM AND IMAGING METHOD

CROSS REFERENCE TO RELATED APPLICATION

This document claims priority to Japanese Patent Application No. 2017-120525 filed Jun. 20, 2017, the entire contents of which are hereby incorporated by reference.

BACKGROUND

Conventional semiconductor devices had been miniaturized within a planar structure. However, the number of electrons that can be stored in a memory element decreases particularly in NAND flash memory, which has been on the cutting edge of miniaturization, due to its miniaturization. As a result, the reliability of devices had deteriorated due to the physical limit of device characteristics. A solution to this problem is a three-dimensional memory cell structure in which memory elements are arrayed in a vertical direction. This three-dimensional memory cell structure has solved the physical limit of device characteristics, thereby realizing a large capacity of memory elements.

Manufacturers of NAND flash memory are changing from development of conventional semiconductor device miniaturization technology to development of multi-layer technology in three-dimensional memory structure, aiming for further increase in capacity with an increased number of multilayers. In 2016, devices with three-dimensional memory structures of nearly 50 layers have already been put on the market, while there is still a demand for an increase in the number of layers.

On the other hand, inspection objects of processing result of the multi-layer structure of the memory cell include high-aspect hole, foreign matter in the multi-layer structure, pattern covering multiple levels, all of which cannot be inspected by conventional inspection apparatus and measurement apparatus. Since the number of such inspection objects increases, a new inspection method is required.

In particular, end portions of multilayered memory cell arrays are processed to have a staircase shape. These staircase end portions are used for enabling an upper layer to contact each layer of the multilayered memory cells. For this reason, a defect of the staircase patterns is an important matter affecting a non-defective rate of devices.

A conventional inspection of a two-dimensional pattern in a planar structure device uses an image of a pattern, which is generated by a scanning electron microscope (hereinafter referred to as "SEM") configured to scan a target pattern with an electron beam, detect electrons emitted from the pattern, and convert the electrons into an image.

In order to obtain an image of a pattern formed on a semiconductor wafer, the SEM adjusts the focus of the electron beam using the pattern to be inspected or a pattern in the vicinity of the pattern to be inspected, and then generates the image of the target pattern. A focal depth of the electron beam is several hundreds of nanometers, which is sufficiently large as compared with an asperity of a pattern having a height of at most 100 nm in a planar structure device. Therefore, by adjusting the focus once, it is possible to obtain a clear image of a pattern in the vicinity the target pattern.

In the staircase pattern, a height difference of one step is not more than 100 nm, which is equal to or smaller than the depth of focus of the electron beam. However, a height difference of several tens of steps is several micrometers. As a result, it is impossible to generate a sharp image of the staircase structure with the depth of focus of the electron beam. When images of these three-dimensional layers are to be taken, it is necessary to repeat an adjustment of the focus of the electron beam, a movement to image acquisition coordinates by the XY stage, and image acquisition and inspection for each layer. As a result, an inspection time is remarkably increased.

In the above-described staircase pattern, when a distance between patterns of respective layers is to be inspected, one practical method is to obtain an image of patterns of multiple layers and inspect a relative distance between the patterns on the image. However, when patterns on the multiple layers are to be included in one image, it is impossible to capture a sharp image of patterns whose height difference exceeds the focal depth of the electron beam.

As an existing technology, Japanese laid-open patent document No. 10-149792 discloses a dynamic focus technique. Specifically, this document discloses a scanning electron microscope and a control method thereof in which a focus is changed by an electron beam scanning position when observing an inclined specimen.

However, in order to inspect a semiconductor device, it is necessary to inspect a plurality of positions or a wide region within a plane of a wafer. For this reason, accurate height information in the electron beam scanning range is required for using the above-described known technique.

SUMMARY OF THE INVENTION

Therefore, according to an embodiment, there is provided an imaging system having a scanning electron microscope capable of rapidly obtaining clear images of inspection targets at different heights by calculating height information of image acquisition positions where the electron beam scans using design data, i.e., design information of a semiconductor device.

Embodiments, which will be described below, relate to an imaging system and an imaging method applicable to a dynamic focus technique of a scanning electron microscope.

In an embodiment, there is provided an imaging system comprising: a scanning electron microscope configured to generate an image of a specimen by detecting secondary electrons and backscattered electrons emitted from the specimen while scanning the specimen with an electron beam; a computer having a memory storing design data including two-dimensional design information of each of layers of a three-dimensional multilayer structure constituting a surface of the specimen, the design data further including height information of each of the layers, the computer is configured to: read the two-dimensional design information and the height information from the memory; calculate a height of an image acquisition position on the specimen from the two-dimensional design information and the height information; and instruct the scanning electron microscope to focus the electron beam on the image acquisition position based on the calculated height of the image acquisition position.

In an embodiment, the computer is configured to calculate a distribution of surface heights of the specimen from the two-dimensional design information and the height information.

In an embodiment, the computer is configured to: calculate a scanning magnification change and a rotational angle change of the electron beam which occur with a change in the focus of the electron beam; and instruct the scanning electron microscope to correct a scanning magnification and a rotational angle of the electron beam based on the calculated magnification change and the calculated rotational angle change.

In an embodiment, there is provided an imaging method comprising: reading design data including two-dimensional design information of each of layers of a three-dimensional multilayer structure constituting a surface of a specimen, the design data further including height information of each of the layers; calculating a height of an image acquisition position on the specimen from the two-dimensional design information and the height information; and instructing a scanning electron microscope to focus an electron beam on the image acquisition position based on the calculated height of the image acquisition position.

In an embodiment, the imaging method further comprises calculating a distribution of surface heights of the specimen from the two-dimensional design information and the height information.

In an embodiment, the imaging method further comprises: calculating a scanning magnification change and a rotational angle change of the electron beam which occur with a change in the focus of the electron beam; and instructing the scanning electron microscope to correct a scanning magnification and a rotational angle of the electron beam based on the calculated magnification change and the calculated rotational angle change.

In an embodiment, there is provided a non-transitory computer-readable storage medium storing a program for causing a computer to perform the steps of: reading design data including two-dimensional design information of each of layers of a three-dimensional multilayer structure constituting a surface of a specimen, the design data further including height information of each of the layers; calculating a height of an image acquisition position on the specimen from the two-dimensional design information and the height information; and instructing a scanning electron microscope to focus an electron beam on the image acquisition position based on the calculated height of the image acquisition position.

According to the above-described embodiments, the scanning electron microscope can change the focus of the electron beam according to the change in the surface height of the three-dimensional structure. Therefore, the scanning electron microscope can rapidly generate clear images of inspection targets lying at different heights.

DESCRIPTION OF EMBODIMENTS

Hereinafter, embodiments will be described in detail with reference to the drawings.

Figure 1:
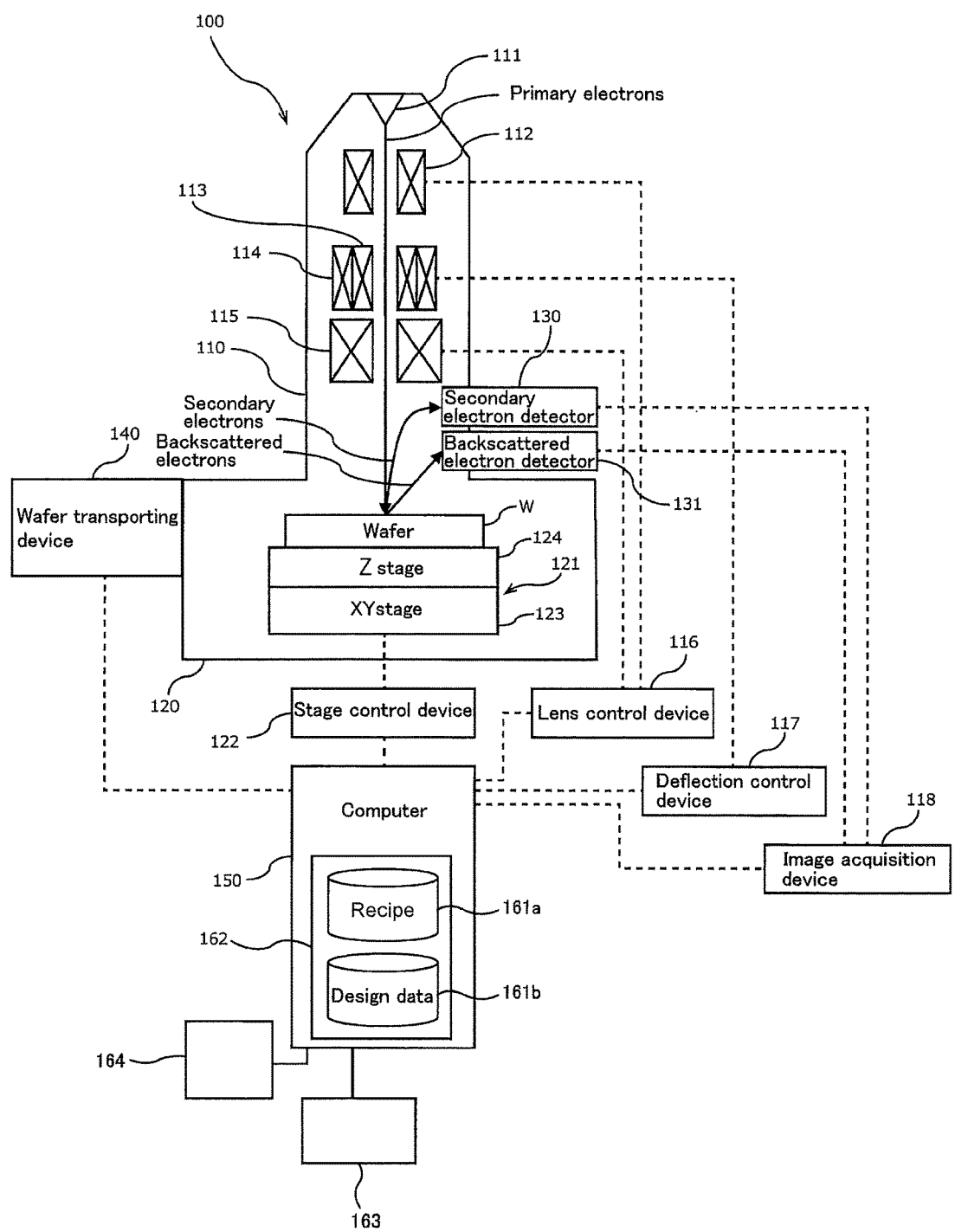
FIG. 1 is a schematic diagram showing an embodiment of an imaging system including a scanning electron microscope.

FIG. 1 is a schematic diagram showing an embodiment of an imaging system including a scanning electron microscope.

As shown in FIG. 1, the imaging system includes a scanning electron microscope 100 and a computer 150 for controlling operations of the scanning electron microscope. The scanning electron microscope 100 includes an electron gun 111 that emits an electron beam composed of primary electrons (charged particles), a converging lens 112 that converges the electron beam emitted from the electron gun 111, an X deflector 113 that deflects the electron beam in an X direction, a Y deflector 114 for deflecting the electron beam in a Y direction, and an objective lens 115 for focusing the electron beam on a wafer W which is a specimen.

The converging lens 112 and the objective lens 115 are coupled to a lens control device 116, and operations of the converging lens 112 and the objective lens 115 are controlled by the lens control device 116. This lens control device 116 is coupled to the computer 150. The X deflector 114 and the Y deflector 115 are coupled to a deflection control device 117, and deflection operations of the X deflector 113 and the Y deflector 114 are controlled by the deflection control device 117. This deflection control device 117 is also coupled to the computer 150. A secondary electron detector 130 and a backscattered electron detector 131 are coupled to an image acquisition device 118. This image acquisition device 118 is configured to convert output signals of the secondary electron detector 130 and the backscattered electron detector 131 into an image. This image acquisition device 118 is also coupled to the computer 150.

A specimen stage 121 is disposed in a specimen chamber 120. The specimen stage 121 includes an XY stage 123 movable in the X direction and the Y direction, and a Z stage 124 movable in the vertical direction. The specimen stage 121 is coupled to a stage control device 122, so that the position of the specimen stage 121 is controlled by the stage control device 122. This stage control device 122 is coupled to the computer 150. A wafer transporting device 140 for placing the wafer W onto the specimen stage 121 in the specimen chamber 120 is also coupled to the computer 150. The computer 150 includes a memory 162 in which a recipe database 161a and a design database 161b are stored, an input device 163 such as a keyboard and a mouse, and a display device 164.

The electron beam emitted from the electron gun 111 is converged by the converging lens 112, and is then focused by the objective lens 115 onto the surface of the wafer W, while the electron beam is deflected by the X deflector 113 and the Y deflector 114. When the wafer W is irradiated with the primary electrons of the electron beam, secondary electrons and backscattered electrons are emitted from the wafer W. The secondary electrons are detected by the secondary electron detector 130, and the backscattered electrons are detected by the backscattered electron detector 131. The signals of the detected secondary electrons and the signals of the backscattered electrons are input into the image acquisition device 118, and are converted into image data. The image data is transmitted to the computer 150, and an image of the wafer W is displayed on the display device 164 of the computer 150.

Operation information necessary for imaging the wafer W is produced as a recipe on the computer 150. This recipe is registered in the recipe database 161a and stored in the memory 162. The computer 150 can read the recipe from the recipe database 161a stored in the memory 162. Design data (including pattern design information) of the wafer W necessary for focusing the electron beam is stored in advance in the memory 162. The design database 161b is built in the memory 162, and the design data of the wafer W is stored in advance in the design database 161b. The computer 150 can read the design data of the wafer W from the design database 161b stored in the memory 162.

Figure 2:
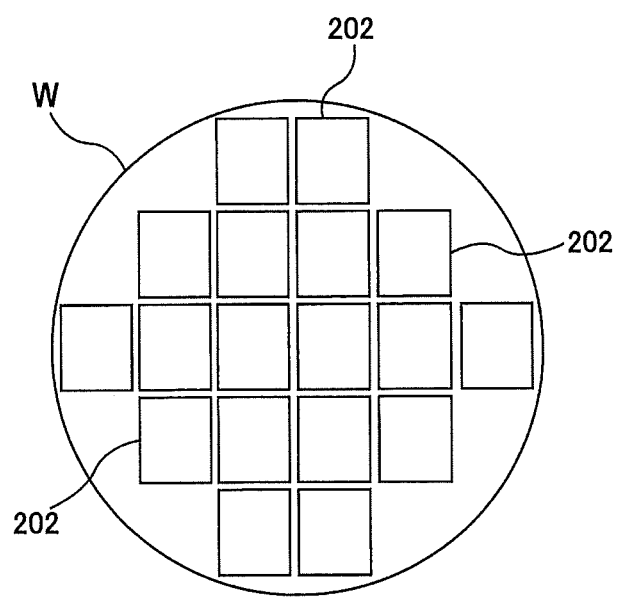
FIG. 2 is a schematic diagram showing a layout of shots on a wafer.
Figure 3:
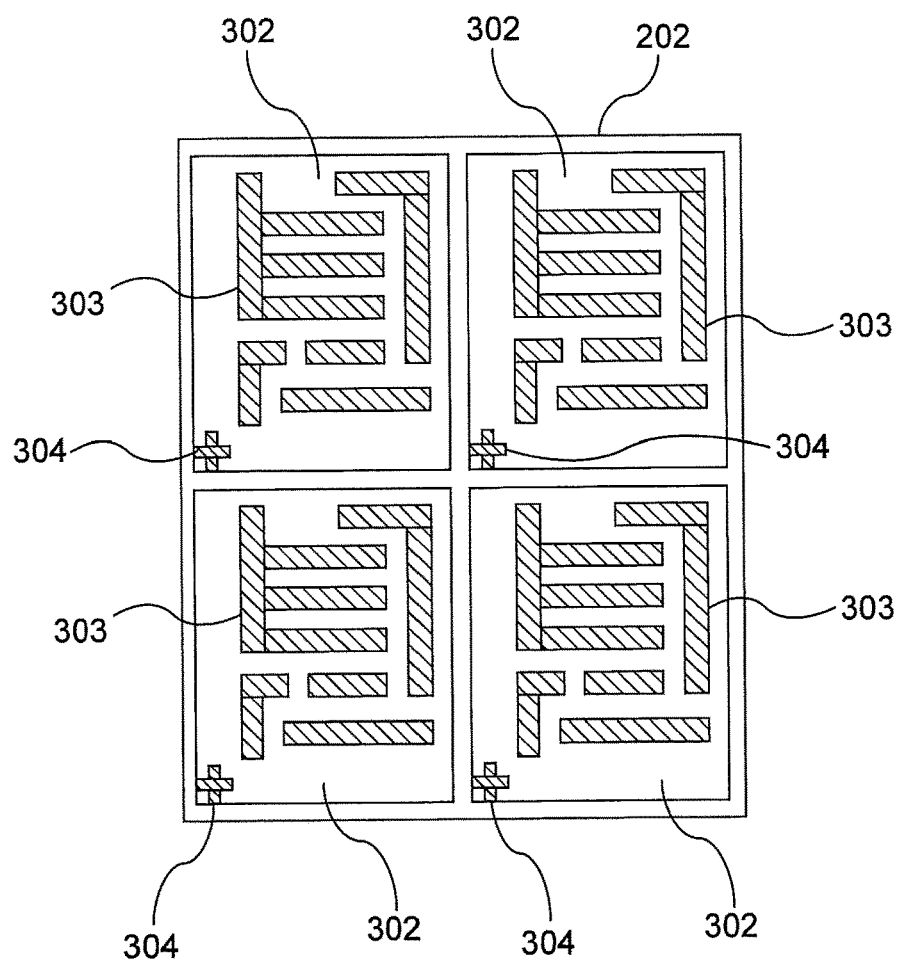
FIG. 3 is a schematic diagram showing a chip layout in a shot.

The wafer W will be described with reference to FIGS. 2 and 3. A plurality of shots 202 are formed on the wafer W. Each shot 202 is a unit for drawing photoresist patterns on the wafer W. The photoresist patterns are used for processing a semiconductor device. As shown in FIG. 3, each shot 202 can include a plurality of chips 302. A pattern 303 is formed in each chip 302. A pattern formed on the lower left side of the chip 302 can be used as a reference pattern 304. An image of the reference pattern 304 can be used for alignment of the wafer W.

The design data is a design diagram of plural types of patterns, such as interconnect, gate, and transistor. The design data includes shape information and position information of the pattern 303 in the chip 302. In a manufacturing process of a semiconductor device, pattern processing is performed on several tens of multilayered films. Therefore, the design data includes data of several tens of layers. Specifically, the design data includes two-dimensional design information of each of the layers and height information of each of the layers.

Figure 4:
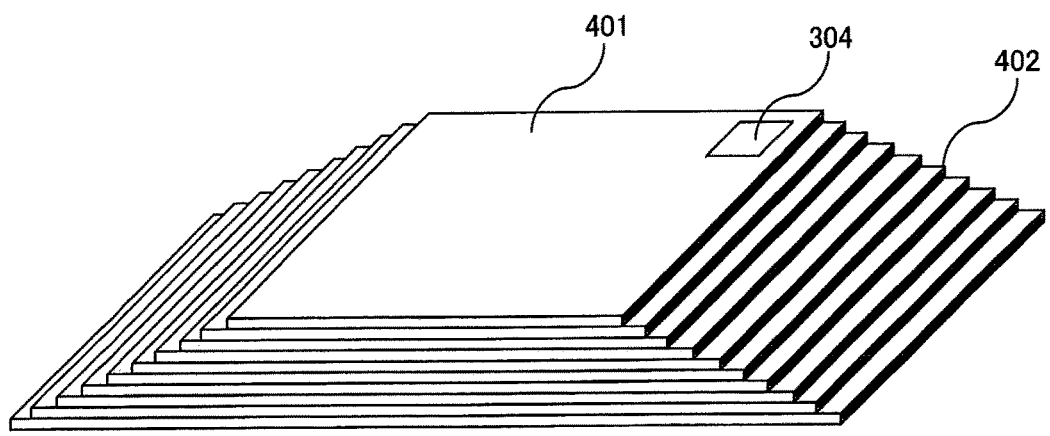
FIG. 4 is a schematic diagram showing a staircase structure of end portion of a memory cell.
Figure 5:
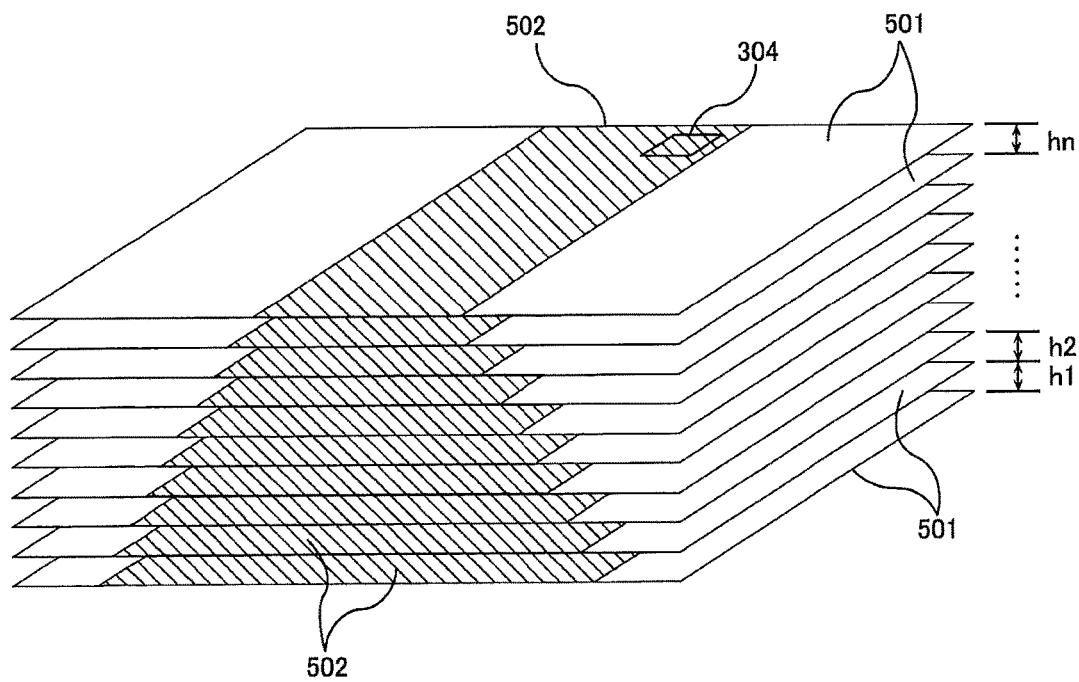
FIG. 5 is a schematic diagram showing design information of the staircase structure of the end portion of the memory cell.

In the pattern inspection of the staircase structure of the end portion of the memory cell, an image of a three-dimensional structure as shown in FIG. 4 is generated. The memory cell is formed in a central portion 401 of this three-dimensional structure. A staircase structure 402 is formed for controlling the memory of each layer. The design data of this three-dimensional structure is shown in FIG. 5. Specifically, the design data includes two-dimensional design information 501 of the respective layers and height information h1 to hn of the respective layers. Patterns 502, expressed in the two-dimensional design information 501 of the respective layers, are superimposed on one another, thereby forming the three-dimensional structure having the staircase structure shown in FIG. 4.

Figure 6:
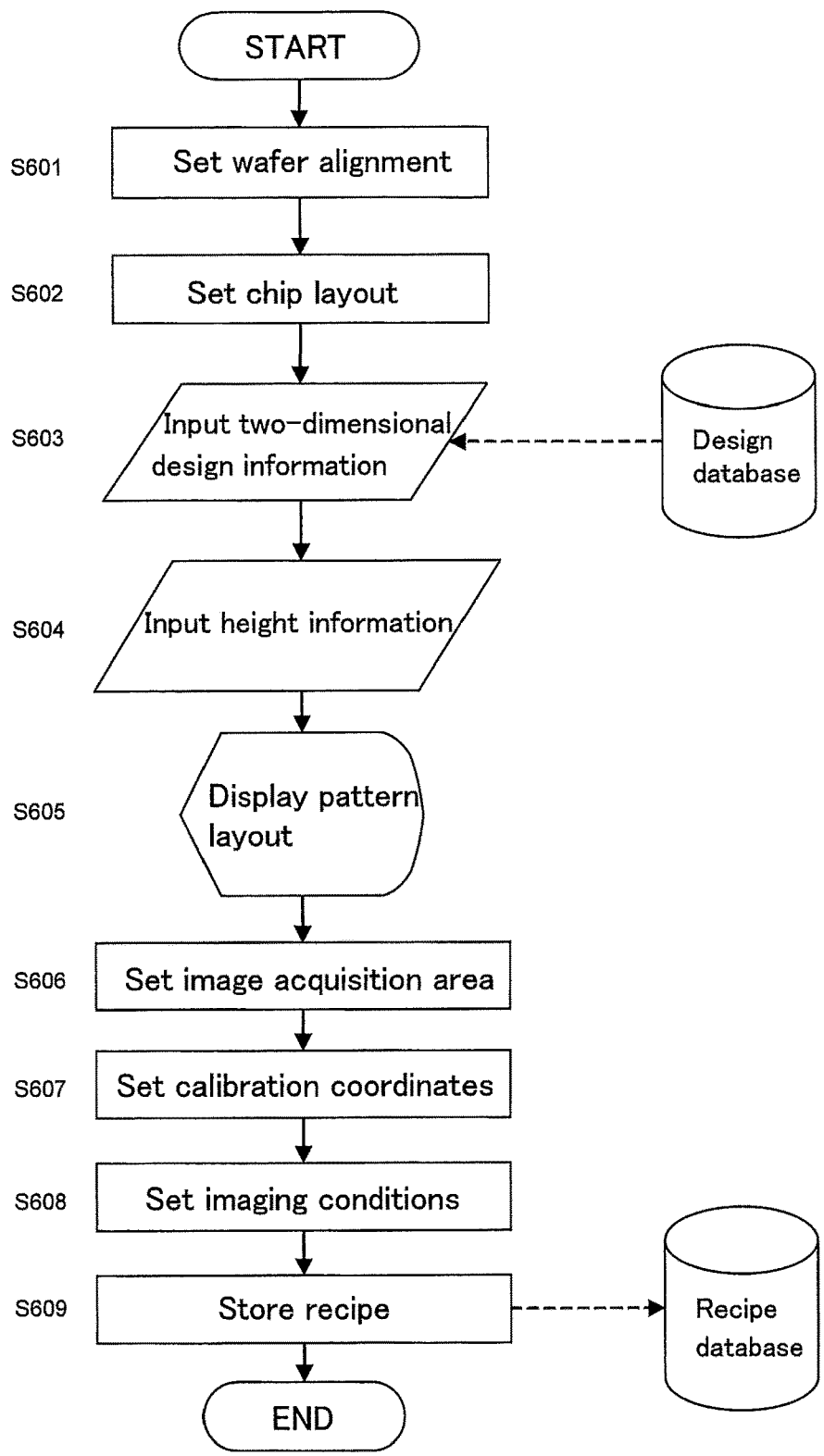
FIG. 6 is a flowchart showing an embodiment for imaging the staircase structure of the end portion of the memory cell.

A recipe for specifying an imaging target and an imaging method is set in the computer 150. A specific method of setting a recipe for imaging the staircase structure shown in FIG. 4 will be described with reference to a flowchart of FIG. 6.

In setting of wafer alignment, wafer alignment information for adjusting shift and rotation of the wafer W placed on the specimen stage 121 by the wafer transporting device 140 is set (S601). Specifically, information for specifying the position of the image of the reference pattern 304 is set. In setting of the chip layout, information on the chip layout for specifying the arrangement of the chips formed on the wafer W is set (S602).

In manufacturing of a semiconductor device, processing is typically performed on films formed on a semiconductor wafer, so that a multilayer structure of the processed films forms a circuit. The design data includes two-dimensional design information representing the shape and the position of the pattern formed on the chip. This design data is read from the design database 161b, and the two-dimensional design information contained in the design data is input to the recipe (S603). An address of the design data on the design database 161b is stored in the recipe. The design data read from the design database 161b further includes height information of a pattern in each layer formed on the chip. The height information of each layer, which is information on a thickness of a film formed on the wafer, is input to the recipe (S604).

The two-dimensional design information of the respective layers that has been input is displayed as a pattern layout on the display device 164 of the computer 150 (S605). This display of the pattern layout is two-dimensional display using different colors for the respective layers, in order to distinguish the respective layer from each other. Displaying the two-dimensional design information on the display device 164 of the computer 150 and displaying coordinates in the chip on the two-dimensional display make it possible to set an image acquisition area and set a calibration coordinate which will be described next.

In setting of the image acquisition area, coordinates for specifying a scanning range for generating the image of the chip are input (S606). It is necessary for the scanning electron microscope 100 to focus the electron beam on the surface of the wafer which is a specimen. In wafer pattern inspection, it is necessary to obtain several tens to several tens of thousands of images. Therefore, it is necessary to automatically perform focus calibration of the electron beam. The focus calibration is generally performed using a sharpness of an image of a pattern in the vicinity of an image acquisition position. Therefore, in order to set the calibration coordinates, the coordinates of the reference pattern 304 in the chip necessary for the focus calibration of the electron beam are set in the recipe (S607).

Control parameters are used in the image generation. The control parameters includes control parameters used in the lens control device 116, control parameters used in the deflection control device 118, and control parameters used in the image acquisition device 118. These control parameters are collectively stored in the computer 150. Since optimum control parameters for image generation vary from layer to layer of patterns, it is possible to register a plurality of control parameters in advance by assigning names to the control parameters. In addition, it is possible to preliminarily register plural types of inspection parameters with names for pattern inspection performed using the generated image. Names of the various control parameters used in the image generation and names of the various inspection parameters used in the pattern inspection are designated in the recipe (S608). The recipe, in which the information of the respective items have been set in this way, is stored in the recipe database 161a of the computer 150 (S609).

Figure 7:
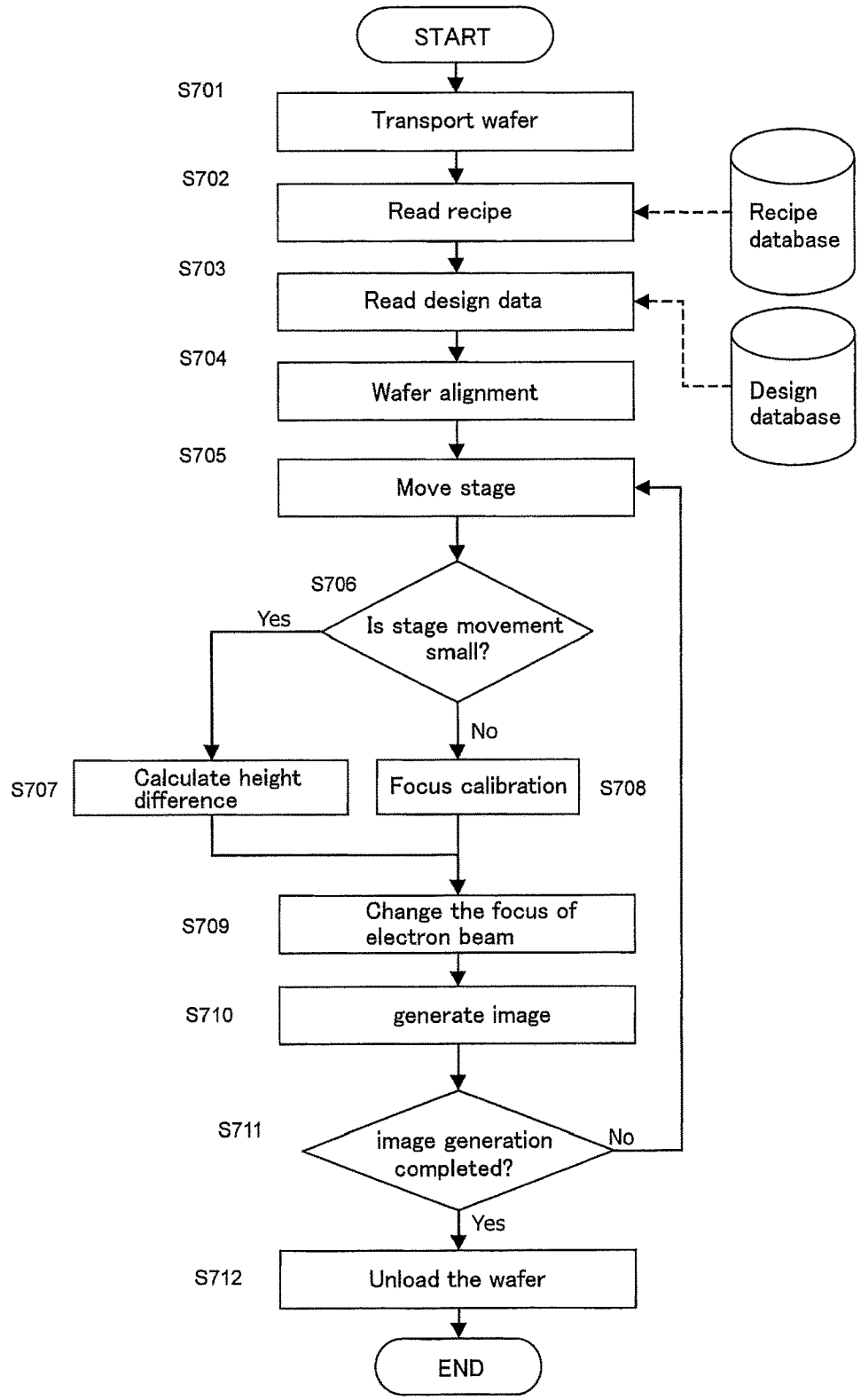
FIG. 7 is a flowchart showing an embodiment for calculating a height using the design information and performing pattern inspection.

The scanning electron microscope 100 automatically generates an image according to the above recipe. Hereinafter, the operation of image generation will be described with reference to FIG. 7. The wafer W is placed on the specimen stage 121 in the specimen chamber 120 by the wafer transporting device 140 (S701). The computer 150 reads the recipe for image generation applied to the wafer W from the recipe database 161a (S702).

Various information registered in this recipe is used in the computer 150 in the operation described below. Various control parameters registered in the recipe are set in the computer 150, the lens control device 116, the deflection control device 118, and the image acquisition device 117 before the image generation is carried out. The computer 150 reads the design data from the design database 161b based on the address of the design data in the design database 161b (S703). The address of the design data is included in the recipe.

In the operation of placing the wafer W onto the specimen stage 121, the wafer W is shifted in the X and Y directions and in the rotational direction. In order to eliminate such shifts, wafer alignment is performed using the image of the reference pattern 304 previously created on the wafer W (S704).

The scanning electron microscope 100 automatically generates tens to tens of thousands of images for the pattern inspection of one wafer. This image generating operation is an operation of repeating movement of the specimen stage 121 (S705) and the image generation (S710). When a movement distance of the specimen stage 121 is larger than a set value (S706), the focus of the electron beam is shifted from the surface of the wafer W due to inclination of the wafer W on the specimen stage 121. Therefore, the focus calibration of the electron beam using the sharpness of the image of the reference pattern 304 is performed (S708).

When the movement distance of the specimen stage 121 is smaller than the set value, for example, when the movement distance of the specimen stage 121 is smaller than 200 μm, the shift of the focus of the electron beam within the same layer in the multilayered structure can be ignored. In this case, it is not necessary to perform the focus calibration. However, in a case of a three-dimensional structure composed of a multilayered structure, it is necessary to change the focus of the electron beam according to the surface height of the three-dimensional structure. The height difference between the reference pattern 304 used for the focus calibration and the image acquisition position (or imaging target position) on the three-dimensional structure can be determined from the two-dimensional design information of each of the layers and the height information of each of the layers (S707). The two-dimensional design information of each of the layers and the height information of each of the layers are included in the design data described above.

The computer 150 instructs the scanning electron microscope 100 to focus the electron beam on the image acquisition position on the wafer surface. More specifically, the computer 150 instructs the lens control device 116 to update a convergence amount of the electron beam to change the focus of the electron beam based on the difference between the height of the reference pattern 304 and the height of the image acquisition position that has been determined in the step S707 (S709). In this manner, the focus of the electron beam is adjusted according to the difference in the surface height of the three-dimensional structure. Examples of a method of adjusting (changing) the focus of the electron beam include a method of changing the convergence of the electron beam by the objective lens 115, a method of changing an electric potential of the X deflector 113 and an electric potential of the Y deflector 114 to change the convergence of the electron beam, a method of changing the electric potential of the wafer W to change the convergence of the electron beam, and a method of changing the height of the wafer W by the Z stage 124 of the specimen stage 121.

After the focus of the electron beam is changed, an image is generated at the image acquisition position (S710). Thereafter, the wafer W is moved by the specimen stage 121, and an image is generated at the next image acquisition position in the same manner. When image generations at all image acquisition positions are completed (S711), the wafer W is taken out from the specimen stage 121 by the wafer transporting device 140 (S712).

Figure 8:
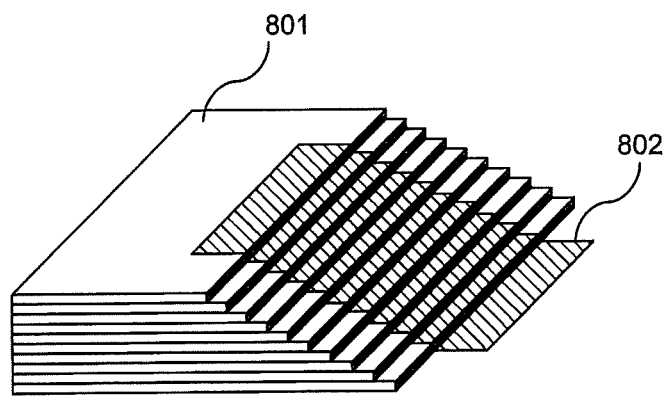
FIG. 8 is a schematic diagram showing a focal plane of an electron beam and a three-dimensional structure.

Next, an embodiment of generating an image of a three-dimensional structure having a height difference in a field of view of the scanning electron microscope 100, i.e., in the scanning range of the electron beam, will be described. FIG. 8 shows a three-dimensional structure 801 and a focal plane 802 of the electron beam along the three-dimensional structure. An image of the three-dimensional structure 801 can be generated with the scanning electron microscope 100 by changing the focus of the electron beam stepwise along the staircase focal plane 802.

An irradiation position of the electron beam on a two-dimensional plane can be specified by numerical values that are input to the deflection control device 117 controlling the X deflector 113 and the Y deflector 114. These numerical values are input from the computer 150 to the deflection control device 117. Further, the computer 150 calculates a distribution of the surface heights of the three-dimensional structure included within the scanning range of the electron beam, from the two-dimensional design information and the height information of each layer included in the design data. Based on the distribution of the surface heights of the three-dimensional structure and the numerical values for controlling the X deflector 113 and the Y deflector 114 (i.e., the irradiation positions of the electron beam on the two-dimensional plane), the computer 150 calculates the height of the image acquisition position on the surface of the three-dimensional structure of the wafer. The computer 150 instructs the scanning electron microscope 100 to adjust the focus of the electron beam to the image acquisition position based on the calculated height of the image acquisition position. In this manner, the scanning electron microscope 100 can change the focus of the electron beam in accordance with the difference in the surface height of the three-dimensional structure.

Examples of a method of adjusting (changing) the focus of the electron beam according to the difference in the surface height of the three-dimensional structure include a method of changing the convergence of the electron beam by the objective lens 115, a method of changing an electric potential of the X deflector 113 and an electric potential of the Y deflector 114 to change the convergence of the electron beam, a method of changing an electric potential of the wafer W to change the convergence of the electron beam, and a method of changing the height of the wafer W by the Z stage 124 of the specimen stage 121.

Figure 9:
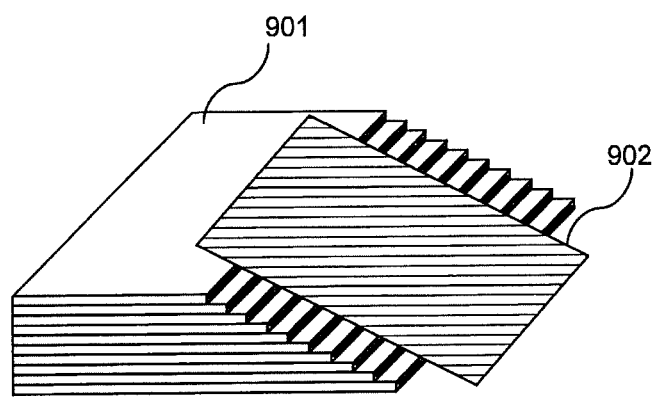
FIG. 9 is a schematic diagram showing a plane lying along a staircase structure formed at an end portion of a three-dimensional structure.

FIG. 9 is a view showing a plane 902 lying along a staircase structure formed at an end portion of a three-dimensional structure 901. Generally, a speed of changing the focus of the electron beam is slower than a deflection speed of the electron beam by the X deflector 113 and the Y deflector 114. Out of focus of the electron beam due to this delay can be prevented by gently changing the focus of the electron beam along the plane 902.

A scanning magnification and a rotational angle of the electron beam slightly change with the change of the focus of the electron beam of the scanning electron microscope 100. As a result, an image generated may be distorted. In order to eliminate such changes in the scanning magnification and the rotational angle of the electron beam, the computer 150 calculates a scanning magnification change and a rotational angle change of the electron beam which occur with the change in the focus of the electron beam. The computer 150 then instructs the scanning electron microscope 100 to correct the scanning magnification and the rotational angle of the electron beam so as to eliminate the calculated magnification change and rotational angle change.

The above-described embodiments can be applied to generating an image of other specimen having a three-dimensional structure, such as MEMS (Micro Electro Mechanical Systems), in addition to a wafer having a three-dimensional structure.

Figure 10:
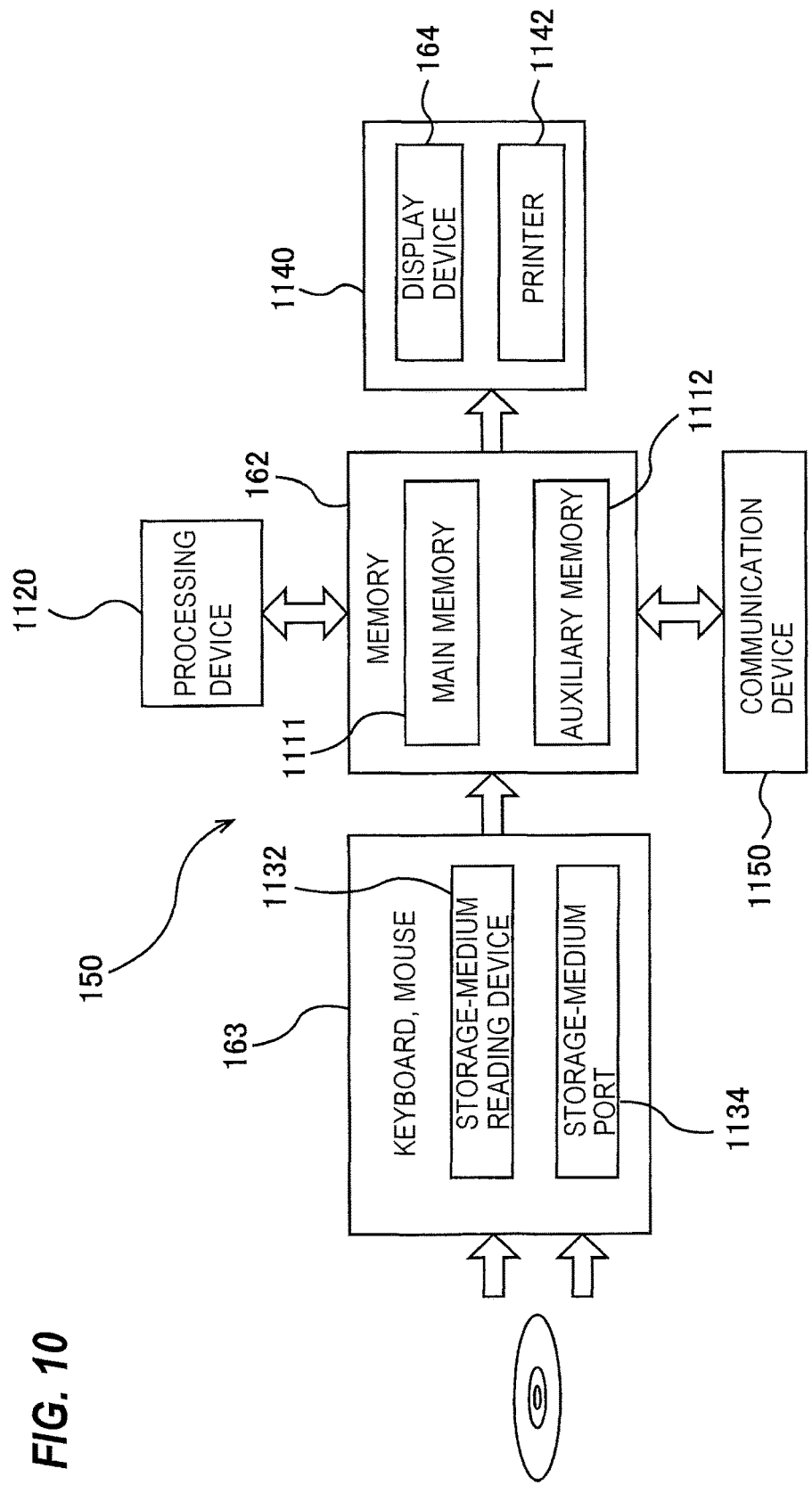
FIG. 10 is a schematic diagram showing a structure of a computer.

FIG. 10 is a schematic diagram showing the configuration of the computer 150. The computer 150 includes a memory 162 in which a program and data are stored, a processing device 1120, such as CPU (central processing unit), for performing arithmetic operation according to the program stored in the memory 162, an input device 163 for inputting the data, the program, and various information into the memory 162, an output device 1140 for outputting processing results and processed data, and a communication device 1150 for connecting to a network, such as the Internet.

The memory 162 includes a main memory 1111 which is accessible by the processing device 1120, and an auxiliary memory 1112 that stores the data and the program therein. The main memory 1111 may be a random-access memory (RAM), and the auxiliary memory 1112 is a storage device which may be a hard disk drive (HDD) or a solid-state drive (SSD).

The input device 163 includes a keyboard and a mouse, and further includes a storage-medium reading device 1132 for reading the data from a storage medium, and a storage-medium port 1134 to which a storage medium can be connected. The storage medium is a non-transitory tangible computer-readable storage medium. Examples of the storage medium include optical disk (e.g., CD-ROM, DVD-ROM) and semiconductor memory (e.g., USB flash drive, memory card). Examples of the storage-medium reading device 132 include optical disk drive (e.g., CD drive, DVD drive) and card reader. Examples of the storage-medium port 1134 include USB terminal. The program and/or the data stored in the storage medium is introduced into the computer 150 via the input device 163, and is stored in the auxiliary memory 1112 of the memory 162. The output device 1140 includes a display device 164 and a printer 1142.

The computer 150 operates according to the program electrically stored in the memory 162. The program is stored in a non-transitory tangible computer-readable storage medium. The computer 150 is provided with the program via the storage medium. The computer 150 may be provided with the program via communication network, such as the Internet.

The above description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. An imaging system comprising:
   a scanning electron microscope configured to generate an image of a specimen by detecting secondary electrons and backscattered electrons emitted from the specimen while scanning the specimen with an electron beam;
   a computer having a memory storing design data including two-dimensional design information of each of layers of a three-dimensional multilayer structure constituting a surface of the specimen, the design data further including height information of each of the layers, the computer is configured to:
      read the two-dimensional design information and the height information from the memory;
      calculate a height of an image acquisition position on the specimen from the two-dimensional design information and the height information; and
      instruct the scanning electron microscope to focus the electron beam on the image acquisition position based on the calculated height of the image acquisition position.

2. The imaging system according to claim 1, wherein the computer is configured to calculate a distribution of surface heights of the specimen from the two-dimensional design information and the height information.

3. The imaging system according to claim 1, wherein the computer is configured to:
   calculate a scanning magnification change and a rotational angle change of the electron beam which occur with a change in the focus of the electron beam; and
   instruct the scanning electron microscope to correct a scanning magnification and a rotational angle of the electron beam based on the calculated magnification change and the calculated rotational angle change.

4. An imaging method comprising:
   reading design data including two-dimensional design information of each of layers of a three-dimensional multilayer structure constituting a surface of a specimen, the design data further including height information of each of the layers;
   calculating a height of an image acquisition position on the specimen from the two-dimensional design information and the height information; and
   instructing a scanning electron microscope to focus an electron beam on the image acquisition position based on the calculated height of the image acquisition position.

5. The imaging method according to claim 4, further comprising:
   calculating a distribution of surface heights of the specimen from the two-dimensional design information and the height information.

6. The imaging method according to claim 4, further comprising:
   calculating a scanning magnification change and a rotational angle change of the electron beam which occur with a change in the focus of the electron beam; and
   instructing the scanning electron microscope to correct a scanning magnification and a rotational angle of the electron beam based on the calculated magnification change and the calculated rotational angle change.

7. A non-transitory computer-readable storage medium storing a program for causing a computer to perform the steps of:
   reading design data including two-dimensional design information of each of layers of a three-dimensional multilayer structure constituting a surface of a specimen, the design data further including height information of each of the layers;
   calculating a height of an image acquisition position on the specimen from the two-dimensional design information and the height information; and
   instructing a scanning electron microscope to focus an electron beam on the image acquisition position based on the calculated height of the image acquisition position.

* * * * *